United States Patent
Yu et al.

(10) Patent No.: US 12,550,631 B2
(45) Date of Patent: Feb. 10, 2026

(54) SEMICONDUCTOR ELEMENT AND METHOD FOR MANUFACTURING SAME

(71) Applicant: KOREA UNIVERSITY RESEARCH AND BUSINESS FOUNDATION, Seoul (KR)

(72) Inventors: Hyun-Yong Yu, Seoul (KR); Seung-Hwan Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 462 days.

(21) Appl. No.: 17/624,954

(22) PCT Filed: Jun. 30, 2020

(86) PCT No.: PCT/KR2020/008531
§ 371 (c)(1),
(2) Date: Jan. 5, 2022

(87) PCT Pub. No.: WO2021/006526
PCT Pub. Date: Jan. 14, 2021

(65) Prior Publication Data
US 2022/0271220 A1   Aug. 25, 2022

(30) Foreign Application Priority Data

Jul. 8, 2019 (KR) .......... 10-2019-0082104

(51) Int. Cl.
*H10N 70/20* (2023.01)
*H10B 63/00* (2023.01)
*H10N 70/00* (2023.01)

(52) U.S. Cl.
CPC ............ *H10N 70/24* (2023.02); *H10B 63/30* (2023.02); *H10N 70/011* (2023.02); *H10N 70/883* (2023.02); *H10N 70/8833* (2023.02)

(58) Field of Classification Search
CPC .... H10N 70/24; H10N 70/88; H10N 70/8833; H10N 70/011; H10N 70/883;
(Continued)

(56) References Cited

U.S. PATENT DOCUMENTS

2014/0252493 A1*  9/2014  Frank ............... H01L 27/092
                                                      257/411
2015/0184283 A1*  7/2015  Tendulkar ......... C23C 14/351
                                                      427/383.1
(Continued)

FOREIGN PATENT DOCUMENTS

JP   2008-243992 A   10/2008
KR   10-1382835 B1    4/2014
(Continued)

OTHER PUBLICATIONS

Park Bae Ho, Resistive Change Device and Method of Fabricating The Same, Nov. 12, 2015 (Year: 2015).*
(Continued)

*Primary Examiner* — Jacob Y Choi
*Assistant Examiner* — Ashley Nicole Blackwell
(74) *Attorney, Agent, or Firm* — NSIP Law

(57) ABSTRACT

The present invention relates to a semiconductor element and a method for manufacturing same, wherein the semiconductor element may comprise: a base element, an intermediate layer formed in at least one direction of the base element; and a metal layer formed on the intermediate layer in a direction opposite to the base element, and wherein a conductive filament may be formed inside the intermediate layer according to the application of a voltage to the intermediate layer.

6 Claims, 9 Drawing Sheets

(58) Field of Classification Search
CPC ...... H10N 70/826; H10B 63/30; H10D 30/47; H10D 30/60; H10D 30/68; H10D 30/83; H10D 48/30; H10D 30/0411; H10D 30/62; H10D 30/831; H01L 21/02; H01L 21/768; H01L 21/0228; H01L 21/76838
See application file for complete search history.

(56) References Cited

U.S. PATENT DOCUMENTS

2016/0141274 A1* 5/2016 Or-Bach ................ H01L 23/36
  257/659
2020/0321396 A1* 10/2020 Wang ................ H10N 70/8833

FOREIGN PATENT DOCUMENTS

KR          101568234 B1 * 11/2015
KR     10-2017-0109170 A     9/2017
KR          20170109170 A *  9/2017  ....... H01L 21/02472

OTHER PUBLICATIONS

Park Bae Ho, (Translation) KR 101568234 B1, Resistive Change Device and Method of Fabricating The Same (Year: 2015).*
Translation of KR 20170109170 A, "Semiconductor Device and the Method Thereof" by Yu et al. (Year: 2017).*
Kim, Seung-Hwan, et al. "Novel Conductive Filament Metal-Interlayer-Semiconductor Contact Structure for Ultralow Contact Resistance Achievement." ACS applied materials & interfaces 10.31 (2018): 26378-26386 (9 pages in English).

* cited by examiner

SEMICONDUCTOR ELEMENT AND METHOD FOR MANUFACTURING SAME

CROSS REFERENCE TO RELATED APPLICATIONS

This application is a U.S. National Stage Application of International Application No. PCT/KR2020/008531, filed on Jun. 30, 2020, which claims the benefit under 35 USC 119(a) and 365(b) of Korean Patent Application No. 10-2019-0082104, filed on Jul. 8, 2019, in the Korean Intellectual Property Office, the entire disclosure of which is incorporated herein by reference for all purposes.

TECHNICAL FIELD

The present invention relates to a semiconductor element and a method of manufacturing the same.

RELATED ART

Currently, semiconductor-based memory elements are installed in most electronic devices to record data. Such a semiconductor memory element may be classified into a volatile memory element and a non-volatile memory element. The volatile memory element may include static random access memory (SRAM), a dynamic RAM (DRAM), and the like. The non-volatile memory element may include a flash memory, a read only memory (ROM), a non-volatile RAM (NVRAM), and the like.

The flash memory element has a non-volatile characteristic and is capable of readily inputting and outputting information and accordingly, is used for various electronic devices in recent years. Among flash memory elements, a NAND flash memory element is designed to store information in a gate oxide layer of a transistor. The NAND flash memory element has been studied in various fields due to its high operating speed and excellent stability and accordingly, has been greatly developed in terms of technology. However, the NAND flash memory element has issues in that a process difficulty of a gate region is high and gate leakage current occurs due to repetition of write and erase operations. Also, research on a NAND flash element is being conducted mainly on stacking technology and floating gates and research on performance improvement of transistors is relatively insufficient. Specifically, the NAND flash memory element is manufactured in a stacking structure. Therefore, it is difficult to add a process for improving performance and it is also difficult to improve stability and reliability of a floating gate that performs a memory functionality.

DETAILED DESCRIPTION

Object

The present invention provides a semiconductor element having excellent performance and high stability and a method of manufacturing the same.

Solution

To outperform the aforementioned issues, provided is a semiconductor element and a method of manufacturing the same.

A semiconductor element may include a base element; an intermediate layer formed in at least one direction of the base element; and a metal layer formed on the intermediate layer in a direction opposite to the base element. A conducting filament may be formed in an inner space of the intermediate layer according to application of a voltage to the intermediate layer.

The conducting filament in the inner space of the intermediate layer may be reduced or removed according to application of a voltage with a polarity opposite to that of the voltage applied to the intermediate layer.

Magnitude of on-current may increase according to formation of the conducting filament.

A thickness of the intermediate layer may have a value between 2 nanometers (nm) and 4 nm.

The intermediate layer may be formed in at least one direction of the base element using an atomic layer deposition process.

The intermediate layer may include a dielectric, and the dielectric may include at least one of hafnium oxide ($HfO_2$), silicon dioxide ($SiO_2$), silicon nitride (SiN), aluminum oxide ($Al_2O_3$), titanium oxide ($TiO_2$), zirconium dioxide ($ZrO_2$), and zinc oxide (ZnO).

The base element may include a substrate and a source installed in one direction of the substrate, the intermediate layer may include a first intermediate layer installed to correspond to the source, and the metal layer may include a first metal layer formed to correspond to the first intermediate layer.

The base element may be a metal-oxide-semiconductor field effect transistor (MOSFET), a fin field effect transistor (FinFET), a high electron mobility transistor (HEMT), or a junction field effect transistor (JFET).

A method of manufacturing a semiconductor element may include forming one or more intermediate layers on a base element; and forming a metal layer corresponding to the one or more intermediate layers on the one or more intermediate layers. A conducting filament may be formed in an inner space of the intermediate layer according to application of a voltage to the intermediate layer.

Effect

According to a semiconductor element and a method of manufacturing the same according to the present invention, it is possible to manufacture and implement a semiconductor element having improved performance and high stability.

Also, since the semiconductor element with the improved performance may be manufactured under a low-temperature process, a process difficulty may be lowered and it is possible to manufacture the semiconductor element with the improved performance without adding a high-difficulty process to the existing process. Therefore, it is possible to reduce manufacturing cost of the semiconductor element and to improve process efficiency.

Also, it is possible to prevent or minimize occurrence of gate leakage current while performing a write operation even at a low voltage and it is possible to reduce power consumption of a semiconductor element accordingly.

BRIEF DESCRIPTION OF DRAWINGS

Detailed description related to each drawing is provided to further sufficiently understand drawings cited in the detailed description of the present invention.

MODE

Figure 1:
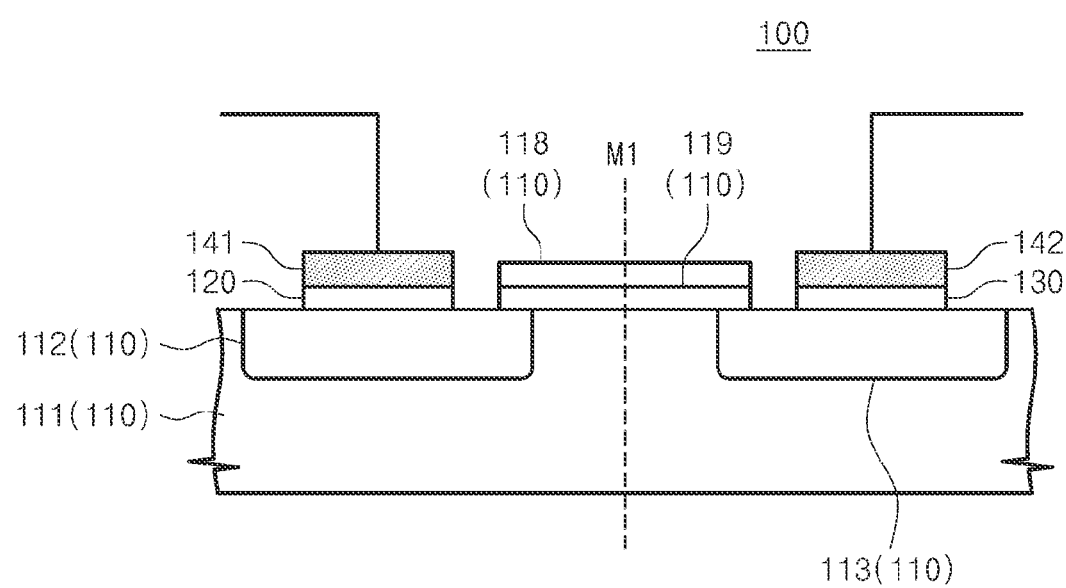
FIG. 1 is a cross-sectional view of a semiconductor element according to an example embodiment.

Unless the context clearly indicates otherwise, like reference numerals refer to like elements used throughout. Also, components used herein, such as, for example, terms "-unit/module," etc., may be implemented as software or hardware. Depending on example embodiments, each component with "-unit/module," etc., may be implemented as a single physical or logical part, or may be implemented as a plurality of physical or logical parts.

It should be noted that if it is described that one component is connected to another component, it may indicate that the one component may be physically or electrically connected to the other component. Also, unless the context clearly indicates otherwise, description that one component includes another component does not exclude still another component in addition to the other component and may further include still another component according to a selection of a designer.

Terms, such as "first," "second," and the like, may be used herein to distinguish one component from other component components and does not indicate sequential representation unless the context clearly indicates otherwise. Also, a singular expression may include a plurality of expression unless the context clearly indicated otherwise.

Hereinafter, some example embodiments of a semiconductor element are described with reference to FIGS. 1 to 9.

FIG. 1 is a cross-sectional view of a semiconductor element according to an example embodiment.

Referring to FIG. 1, a semiconductor element 100 may include a base element 110, one or more intermediate layers 120 and 130 formed on at least one surface of the base element 110, and metal layers 141 and 142 respectively formed on the one or more intermediate layers 120 and 130.

According to an example embodiment, the base element 110 may be a transistor. The transistor may be a field effect transistor (FET). Also, the FET may be a metal-oxide-semiconductor field effect transistor (MOSFET), a fin field effect transistor (FinFET), a high electron mobility transistor (HEMT), or a junction field effect transistor (JFET). However, the scope of the present invention is not limited thereto. As described in the following, other semiconductor elements that require a source 112 and a drain 113 may be examples of the base element 110.

In an example in which the base element 110 is a MOSFET, the base element 110 may include a substrate 111, the source 112 (also, referred to as a source electrode) formed on at least one surface of the substrate 111, the drain 113 (also, referred to as a drain electrode) formed to be separate from the source 112 on the substrate 111, a gate 118 (also, referred to as a gate electrode) formed between the source 112 and the drain 113 and configured to control flow of current between the source 112 and the drain 113 according to application of a voltage. The source 112 and the drain 113 may be implemented using a p-type semiconductor or an n-type semiconductor. In this case, the substrate 111 may be implemented using a semiconductor (i.e., an n-type semiconductor or a p-type semiconductor) different from the source 112 and the drain 113 to correspond to a type of the source 112 and the drain 113. The gate 118 may be installed on one surface of the substrate 111 in direct contact therewith. Depending on example embodiments, the base element 110 may further include a gate dielectric 119 installed between the gate 118 and the substrate 111. The dielectric 119 prevents current from flowing from the gate 118 into the substrate 111. In this case, the gate 118 is installed on the gate dielectric 119 to not come in direct contact with the substrate 111. The gate dielectric 119 may use silicon dioxide and the like, but is not limited thereto. A channel that provides a path for current flowing between the source 112 and the drain 113 may be formed in a portion of the substrate 111 present between the source 112 and the drain 113. The channel may be formed depending on whether a voltage is applied to the gate 118. For example, the channel may be formed when the voltage is applied to the gate 118, or conversely, may be formed when application of the voltage to the gate 118 is blocked. Although it is illustrated in FIG. 1 that the source 112 and the drain 113 are installed on the same surface of substrate 111, and the source 112 is installed on the left and the drain 113 is installed on the right, it is provided as an example only and positions of the source 112 and the drain 113 are not limited thereto.

Figure 2:
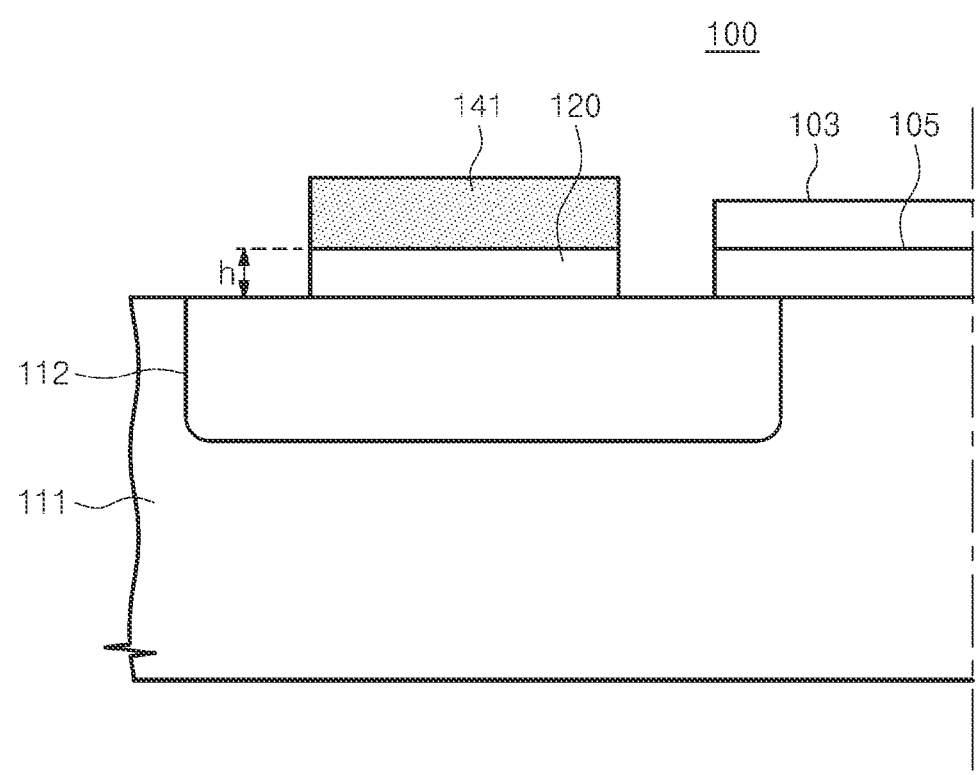
FIG. 2 is a partially enlarged cross-sectional view for an example embodiment of the semiconductor element of FIG. 1.

FIG. 2 illustrates a partially enlarged cross-sectional view for an example embodiment of the semiconductor element of FIG. 1.

Referring to FIGS. 1 and 2, the semiconductor element 100 may include the one or more intermediate layers 120 and 130 and the one or more metal layers 141 and 142 formed on the one or more intermediate layers 120 and 130 to correspond to the one or more intermediate layers 120 and 130.

The intermediate layer 120, 130 and the metal layer 141, 142 may be installed in at least one direction of the base element 110. In this case, the intermediate layer 120, 130 and the metal layer 141, 142 may be formed in contact with at least one surface of the source 112 and the drain 113 or to be adjacent thereto. In detail, the intermediate layer 120 (hereinafter, a first intermediate layer) may be formed on one surface of the source 112 that is externally exposed and the metal layer 141 (hereinafter, a first metal layer) may be formed in another direction of the first intermediate layer 120 opposite to a direction in which the source 112, that is, the base element 110 is formed. Likewise, the intermediate layer 130 (hereinafter, a second intermediate layer) may be formed on one surface of the drain 113 that is externally exposed and the metal layer 142 (hereinafter, a second metal layer) may be formed in a direction of the second intermediate layer 130 opposite to a direction in which the drain 113 is formed. That is, a structure of the base element 110-intermediate layer 120, 130-metal layer 141, 142 is formed by sequentially stacking the source 112, the first intermediate layer 120, and the first metal layer 141 and/or by sequentially stacking the drain 113, the second intermediate layer 130, and the second metal layer 142.

The first metal layer 141 and the second metal layer 142 may be implemented using a predetermined metal material and, depending on example embodiments, may be implemented using the same type of metal material or may be implemented using different types of metal materials. Here, the metal material may include gold (Au), copper (Cu), nickel (Ni), titanium (Ti), oxide thereof, and/or compound between the same and another element. Also, the first metal layer 141 and the second metal layer 142 may be implemented by combining at least two metal materials. For example, the first metal layer 141 and the second metal layer 142 may be implemented by stacking two metal plates made of different metals. Also, the first metal layer 141 and the second metal layer 142 may be in the same or similar shape or may be in different shapes. For example, both may be in a shape of a flat plate. The first metal layer 141 and/or the second metal layer 142 may be electrically connected to an outside through a conductive wire or a metal circuit. A voltage with predetermined magnitude may be applied to the first metal layer 141 and/or the second metal layer 142 through an external power source (not shown).

The first intermediate layer 120 and the second intermediate layer 130 may be implemented using a dielectric (also, referrable to as a dielectric material). The dielectric may include hafnium oxide ($HfO_2$), aluminum oxide ($Al_2O_3$), zirconium dioxide ($ZrO_2$), silicon dioxide ($SiO_2$), silicon nitride (SiN), zinc oxide (ZnO), and/or titanium oxide ($TiO_2$), but is not limited thereto. As described below, a plurality of materials capable of forming a conducting filament (123 of 6) may be used for the first intermediate layer 120 and/or the second intermediate layer 130.

According to an example embodiment, the first intermediate layer 120 and/or the second intermediate layer 130 may be implemented in a shape of a flat plate or a film having a predetermined thickness h. In this case, the thickness h of the first intermediate layer 120 and/or the second intermediate layer 130 may have a value between about 2 nanometers (nm) and 4 nm, but depending on example embodiments, may have a relatively thinner or thicker thickness.

The first intermediate layer 120 and/or the second intermediate layer 130 may be installed on the base element 110 by applying and forming the dielectric with an appropriate thickness, for example, a thin thickness on one surface of the base element 110. In this case, the first intermediate layer 120 and/or the second intermediate layer 130 may be formed on the base element 110 using an atomic layer deposition (ALD) process. Also, the first intermediate layer 120 and/or the second intermediate layer 130 may be formed on the base element 110 using a physical vapor deposition (PVD) process or a chemical vapor deposition (CVD) process. In the case of depositing the first intermediate layer 120 and/or the second intermediate layer 130 on the source 112 and the drain 113 of the base element 110 through the above processes, a new mask process is not required. Therefore, it is possible to easily implement the structure of the base element 110-intermediate layer 120, 130-metal layer 141, 142.

Figure 3:
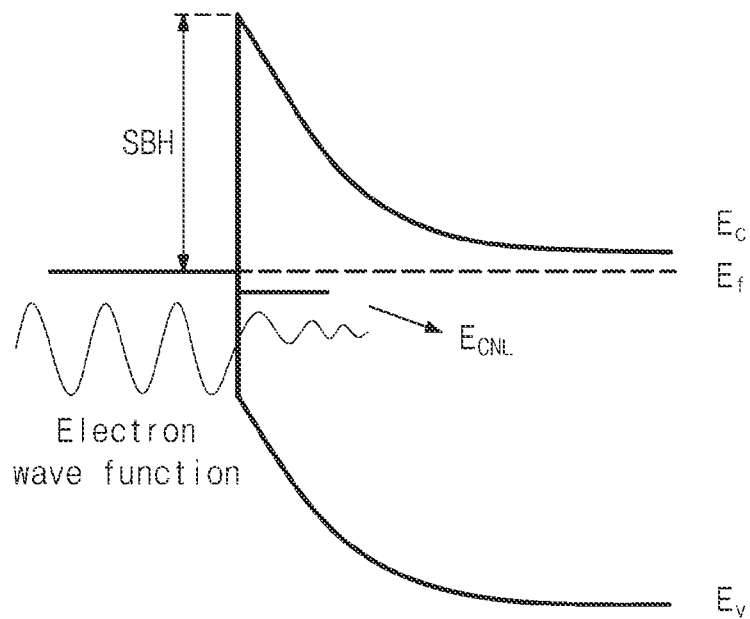
FIG. 3 illustrates an example of a vertical current level of a sour/drain contact when an intermediate layer is absent.
Figure 4:
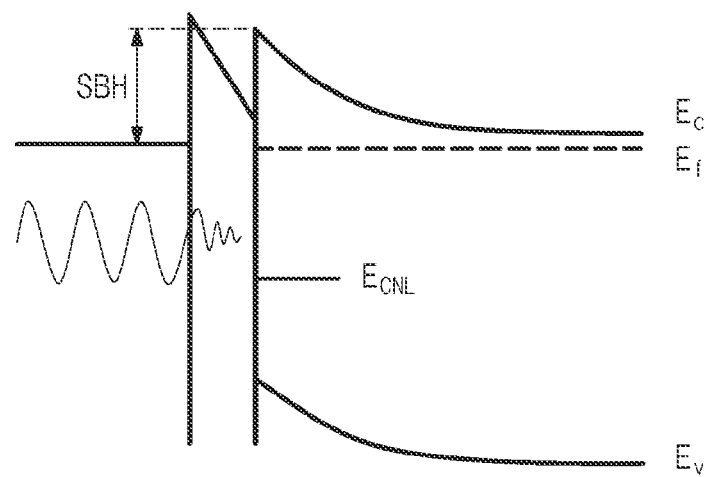
FIG. 4 illustrates an example of a vertical current level of a source/drain contact when an intermediate layer is included.

FIG. 3 illustrates an example of a vertical current level of a sour/drain contact when an intermediate layer is absent, and FIG. 4 illustrates an example of a vertical current level of a source/drain contact when an intermediate layer is included. In FIGS. 3 and 4, $E_c$ denotes a conduction band, $E_f$ denotes a Fermi level, $E_v$ denotes a valence band, and $E_{cnl}$ denotes a charge neutrality level.

Dissimilar to the aforementioned description, if the intermediate layers 120 and 130 are absent, the metal layers 141 and 142 may be in direct contact with the base element 110. In this case, if a predetermined voltage is applied to the metal layers 141 and 142, an electron wave function as illustrated in FIG. 3 penetrates from the metal layers 141 and 142 into the surface of the base element 110, for example, the surface of the source 112 and/or the surface of the drain 113 and a metal-induced gap state (MIGS) is formed on the surface of the base element 110 accordingly. The MIGS causes strong Fermi level pinning and forms high Schottky barriers on the surface of the base element 110. That is, as illustrated in FIG. 3, Schottky barrier height (SBH) relatively increases and high contact resistance occurs accordingly. Such high contact resistance inhibits movement of electrons.

On the contrary, as described above, when the intermediate layers 120 and 130 made of dielectric are inserted between the base element 110 and the metal layers 141 and 142, respectively, the electron wave function delivered from the metal layers 141 and 142 is blocked by the intermediate layers 120 and 130, and the MIGS is relatively reduced and thereby formed on the surface of the base element 110 according to blocking of the electron wave function or barely formed. Also, Schottky barriers are formed to be low (i.e., the SBH decreases). Therefore, contact resistance relatively decreases and electrons may move between the source 112 or the drain 113, the intermediate layer 120, 130, and the metal layer 141, 142 through tunneling. The electron wave function may be better blocked as the thickness h of the intermediate layer 120, 130 increases. However, when the thickness h of the intermediate layer 120, 130 increases to a predetermined level or more, tunneling resistance of electrons may increase and contact resistance may also increase correspondingly thereto.

Therefore, the semiconductor element 100 may have relatively low contact resistance and may have more excellent performance.

Figure 5:
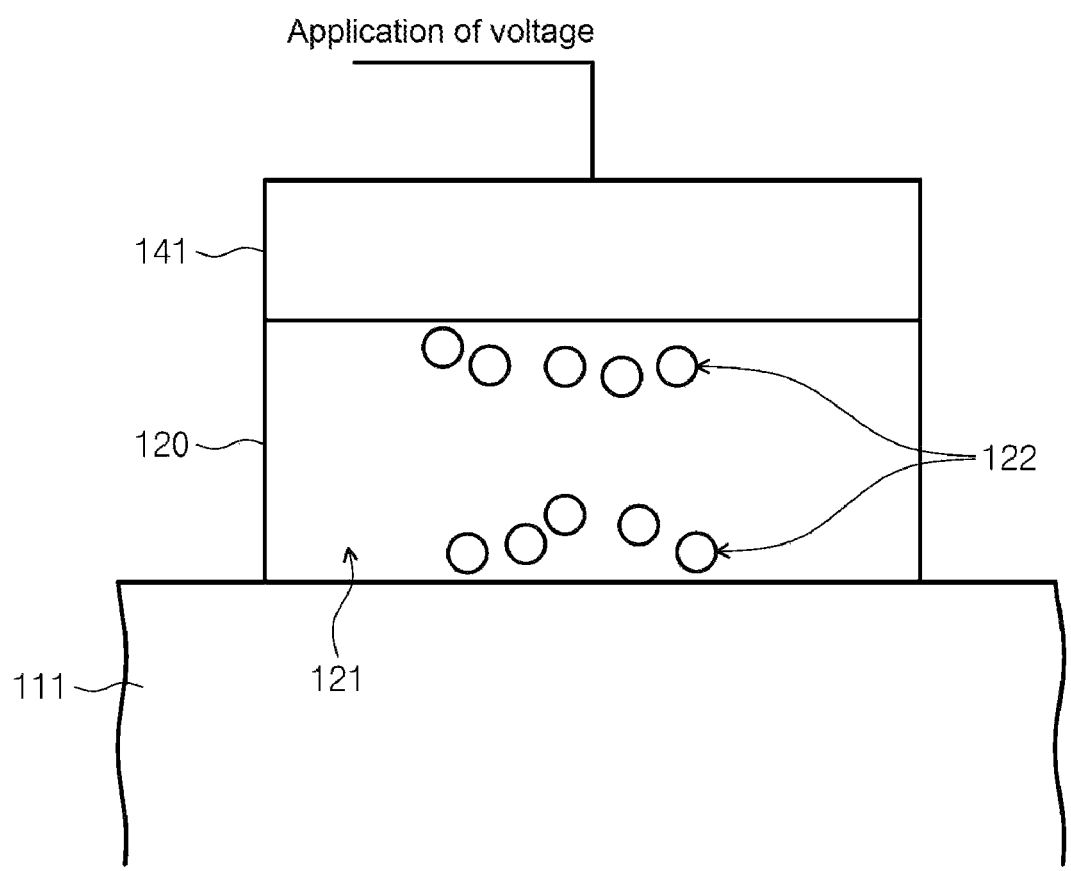
FIG. 5 is a first view illustrating an example of a conducting filament.
Figure 6:
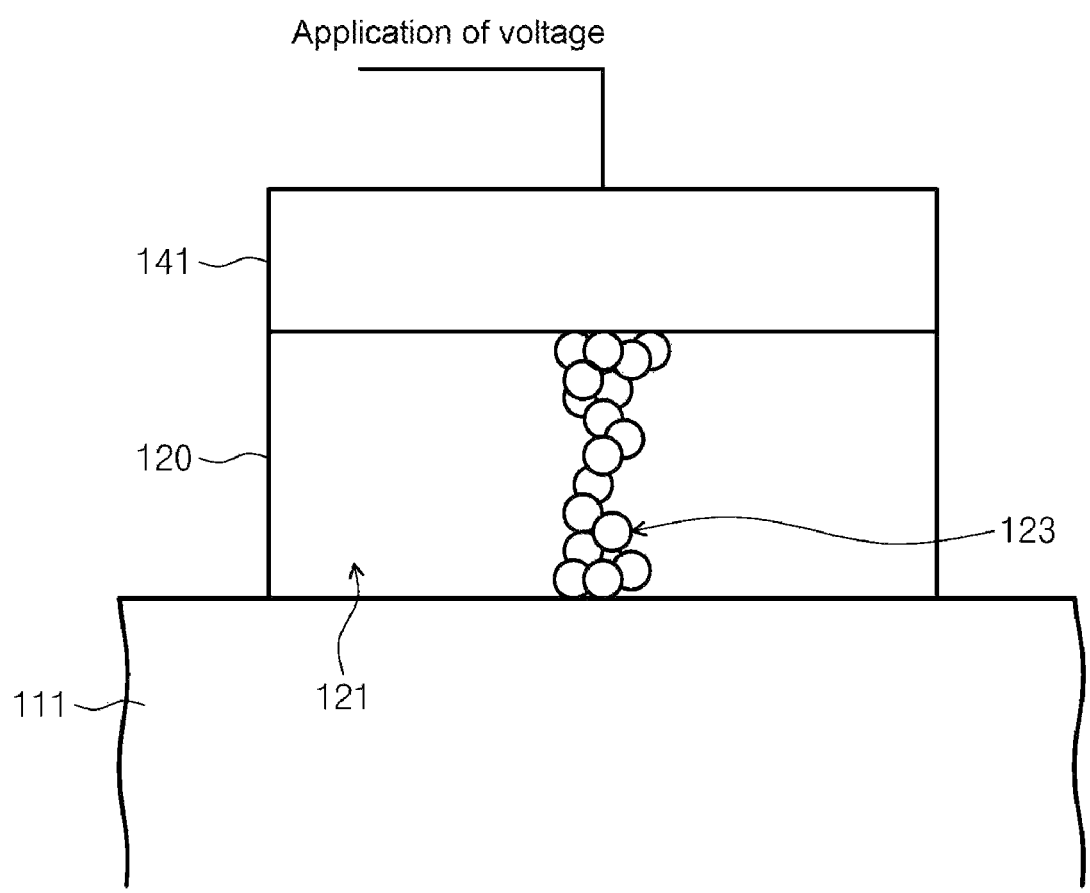
FIG. 6 is a second view illustrating an example of a conducting filament.

FIG. 5 is a first view illustrating an example of a conducting filament, and FIG. 6 is a second view illustrating an example of a conducting filament. Although FIGS. 5 and 6 illustrate only the first intermediate layer 120 for clarity of description, description related thereto may apply alike to the second intermediate layer 130.

Figure 7:
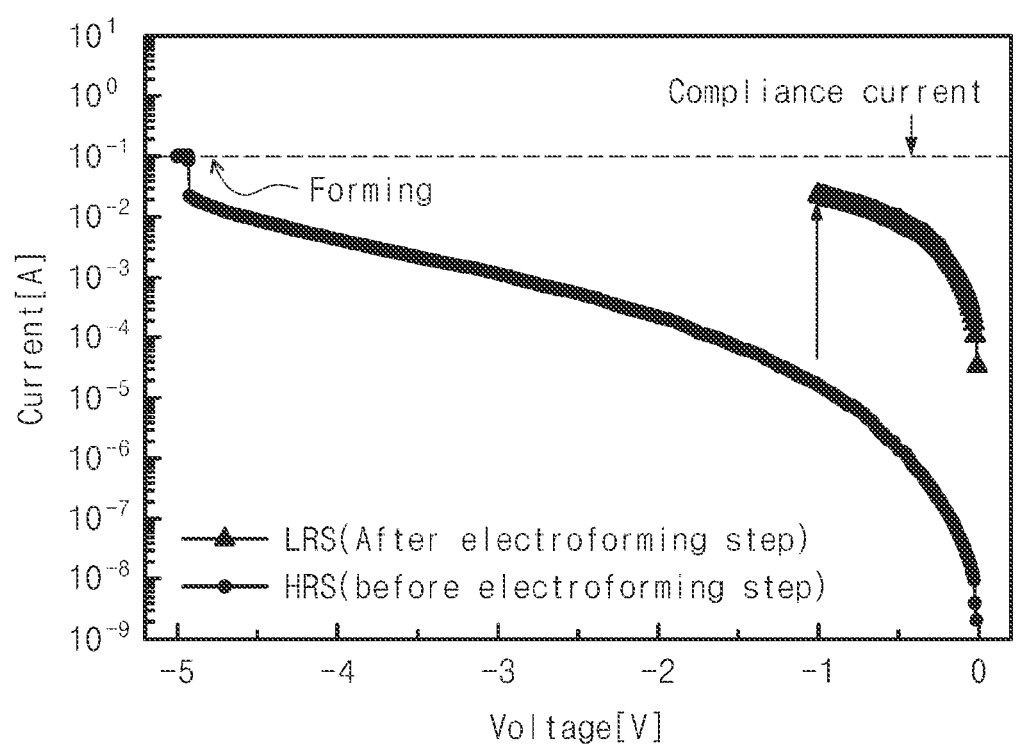
FIG. 7 is a graph describing a formation voltage of a conducting filament.

Referring to FIGS. 5 and 7, a conducting filament (CF) 123 may be further formed in an inner space 121 of the first intermediate layer 120. Formation of the conducting filament 123 may be performed according to application of a voltage to the first intermediate layer 140. In detail, if a voltage with a predetermined magnitude is applied to the first intermediate layer 140 using the first metal layer 141 and the base element 100, an electroforming phenomenon (or a soft breakdown phenomenon) occurs in the inner space 121 of the first intermediate layer 120 and the conducting filament 123 is formed in the inner space 121 of the first intermediate layer 140. In this case, the applied voltage may include a voltage of about 5V or less. In more detail, if a positive voltage or a negative voltage with predetermined magnitude is applied to the first metal layer 141, oxygen vacancies 122 flow in or are formed in the inner space 121 of the first intermediate layer 120 in response to application of the positive voltage or the negative voltage. The inflow or formed oxygen vacancies 122 move in a direction in which the source 112 is arranged and are accumulated at or around an interface between the first intermediate layer 120 and the source 112. The oxygen vacancies 122 are accumulated and grow to the first metal layer 141, and finally, as illustrated in FIG. 6, the conducting filament 123 is formed in the inner space 121. Here, the conducting filament 123 may be formed by extending from about an interface with the source 112 to about an interface with the first metal layer 141. The formed conducting filament 123 provides a path through which electrons may easily move into the inner space 121 of the first intermediate layer 120. Therefore, it is possible to relatively increase conductivity of the first intermediate layer 120 while relatively decreasing magnitude of contact resistance.

The aforementioned conducting filament 123 may be removed by applying a voltage of a polarity different from that of the applied voltage. For example, the conducting filament 123 formed in the inner space 121 of the first intermediate layer 120 according to application of a positive voltage may be reduced or may disappear and be removed if a voltage of a polarity opposite to that of the applied voltage, that is, a negative voltage is applied. On the contrary, the conducting filament 123 formed in the inner space 121 of the first intermediate layer 120 according to application of a negative voltage may be reduced or disappear if a positive voltage is applied. Therefore, formation or removal of the conducting filament 123 may be controlled by selecting and adjusting a polarity of a voltage applied to the first intermediate layer 120. Also, contact resistance may be adjusted through formation and/or removal of the conducting filament 123. Also, on-current of the semiconductor element 100 may be changed based on adjustment of the contact resistance. This represents that the semiconductor element 100 may be used as a memory element (e.g., a flash memory element element).

FIG. 7 is a graph describing a formation voltage of a conducting filament. FIG. 7 shows a vertical current level difference at a contact point before and after conducting filament formation. Here, the x-axis denotes voltage and the y-axis denotes current.

Referring to FIG. 7, after occurrence of electroforming (i.e., when the conducting filament 123 is formed), relatively greater current occurs under the same voltage compared to a case of non-occurrence of electroforming (i.e., when the conducting filament 123 is not formed). That is, according to formation of the conducting filament 123, the contact resistance decreases and greater current flows at a contact point. Meanwhile, a high voltage is not required to form the conducting filament 123. This represents that the semiconductor element 100 may write information even with a low voltage (e.g., a voltage of 5V or less). Compared to the conventional NAND flash element that requires a voltage of about 20V for a write operation, the semiconductor element 100 may perform a write operation with relatively lower voltage, thereby reducing power consumption of each element 100.

Figure 8:
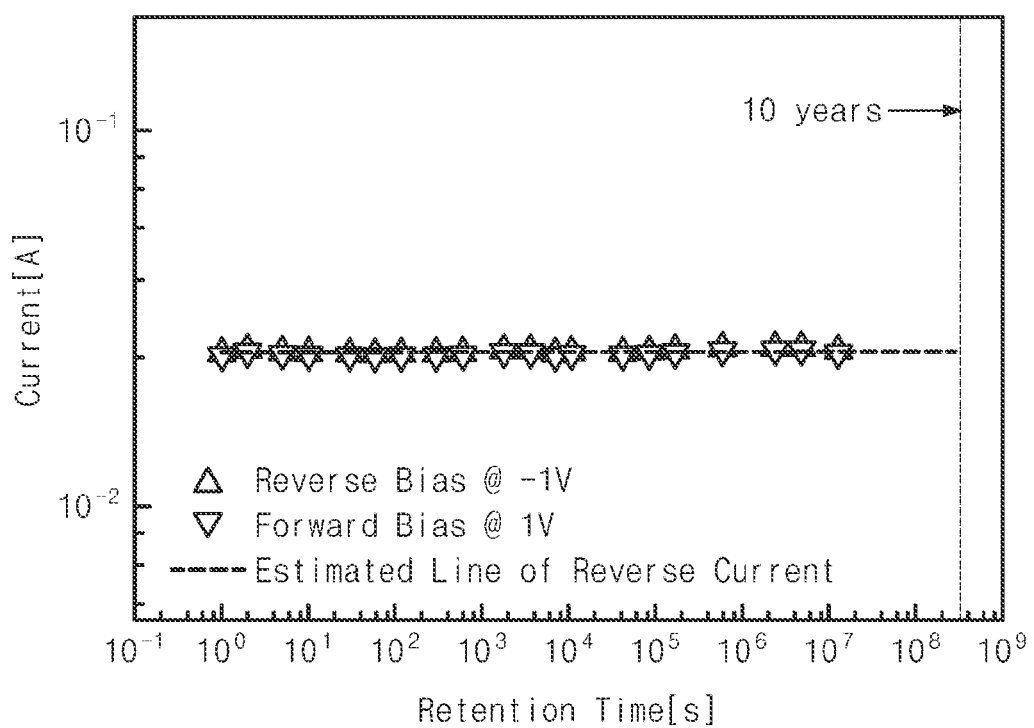
FIG. 8 is a graph describing stability of a conducting filament.

FIG. 8 is a graph describing stability of a conducting filament. Here, the x-axis denotes a retention time and the y-axis denotes measured current. Also, in FIG. 8, a triangle represents current measured at a specific point in time after forming a conducting filament by applying a reverse bias voltage of −1V and an inverted triangle represents current measured at a specific point in time after forming the conducting filament by applying a forward bias voltage of 1V.

Referring to FIG. 8, magnitude of current repeatedly measured every predetermined time or at regular intervals after formation of the conducting filament 123 was approximately the same or similar. This was almost the same even when a reverse bias voltage was applied (i.e., when a negative voltage was applied) or when a forward bias voltage was applied (i.e., when a positive voltage was applied). When the current measured every predetermined time or at regular intervals is interconnected, it appears as a line segment (a dotted line of FIG. 8) that is generally parallel to the x-axis as illustrated in FIG. 8. That is, the magnitude of current measured after formation of the conducting filament 123 tends to be largely maintained (i.e., remain unchanged) despite of passage of time. This represents that the formed conducting filament 123 is stably maintained in the inner space 121 of the intermediate layer 120, 130. The stability of the conducting filament 123 demonstrates that the aforementioned semiconductor element 100 may be used as a non-volatile element.

Figure 9:
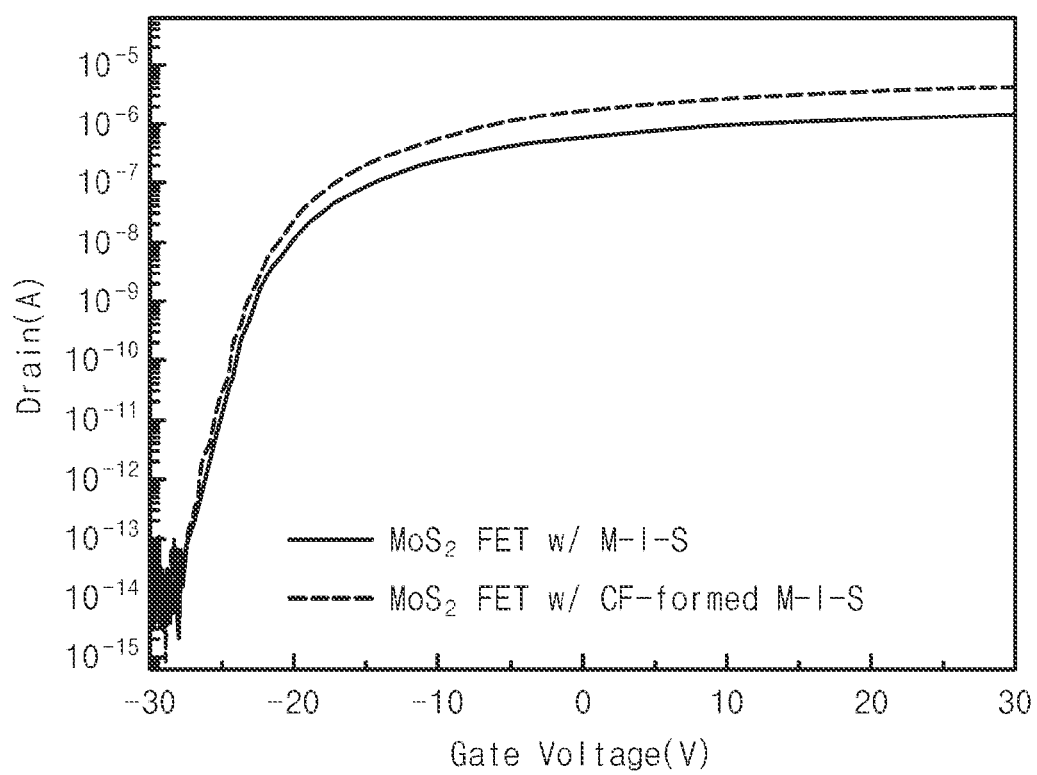
FIG. 9 is a graph showing an example of a difference of on-current of a semiconductor element depending on whether a conducting filament is formed.

FIG. 9 is a graph showing an example of a difference of on-current of a semiconductor element depending on whether a conducting filament is formed. In FIG. 9, the x-axis denotes magnitude of a voltage applied to the gate 118 and the y-axis denotes magnitude of current delivered to the drain 113. A black curve represents a relationship between the current applied to the gate 118 and the current delivered to the drain 113 when the conducting filament 123 is not formed, and a red curve represents a relationship between the current applied to the gate 118 and the current delivered to the drain 113 when the conducting filament 123 is formed.

As described above, formation and/or removal of the conducting filament 123 allows the aforementioned semiconductor element 100 to have memory properties. In detail, referring to FIG. 9, in a situation when the same voltage is applied to the gate 118, the magnitude of on-current measured when the conducting filament 123 is formed relatively greater than the magnitude of current measured when the conducting filament 123 is not formed. Such a difference in current may be used to determine a formation status of the conducting filament 123 and further may be used to determine an application status of a voltage for formation of the conducting filament 123. Therefore, the semiconductor element 100 may be used as a device, that is, a memory device to write information by writing information through application of a predetermined voltage during a write operation and by measuring magnitude of current (or a difference in current, etc.) during a read operation. Also, information written in the semiconductor element 100 may be removed by applying a voltage of a polarity opposite to that of a voltage applied during the write operation. That is, the memory device implemented based on the semiconductor element 100 may also perform an erase operation and may also perform a rewrite operation by re-applying a predetermined voltage (a voltage having a polarity the same as or different from that of a voltage applied at the time of writing).

As described above, when the intermediate layers 120 and 130 are added, performance (e.g., an operation speed) of the semiconductor element 100 may be significantly improved according to a decrease in contact resistance compared to the conventional other elements (e.g., a NAND flash memory element). Also, since the aforementioned formation of the intermediate layers 120 and 130 may be performed under a low-temperature process, there is an advantage in that a process difficulty is relatively low compared to the NAND flash memory element. In addition, the aforementioned semiconductor device 100 may prevent or minimize the occurrence of gate leakage current caused by repetition of the write operation and the erase operation, which may lead to solving an increase in power consumption according to the leakage current.

The semiconductor element 100 may be used for various purposes in various fields. For example, the semiconductor element 100 may be used as a memory element to write data, for example, a non-volatile memory element. Also, the semiconductor element 100 may apply to a semiconductor element (e.g., a memory element, a light receiving element, etc.) manufactured using a two-dimensional (2D) material, for example, graphene, black phosphorus, molybdenum disulfide ($MoS_2$) and/or tungsten diselenide ($WSe_2$).

Hereinafter, an example embodiment of a method of manufacturing a semiconductor element is described with reference to FIG. 10.

Figure 10:
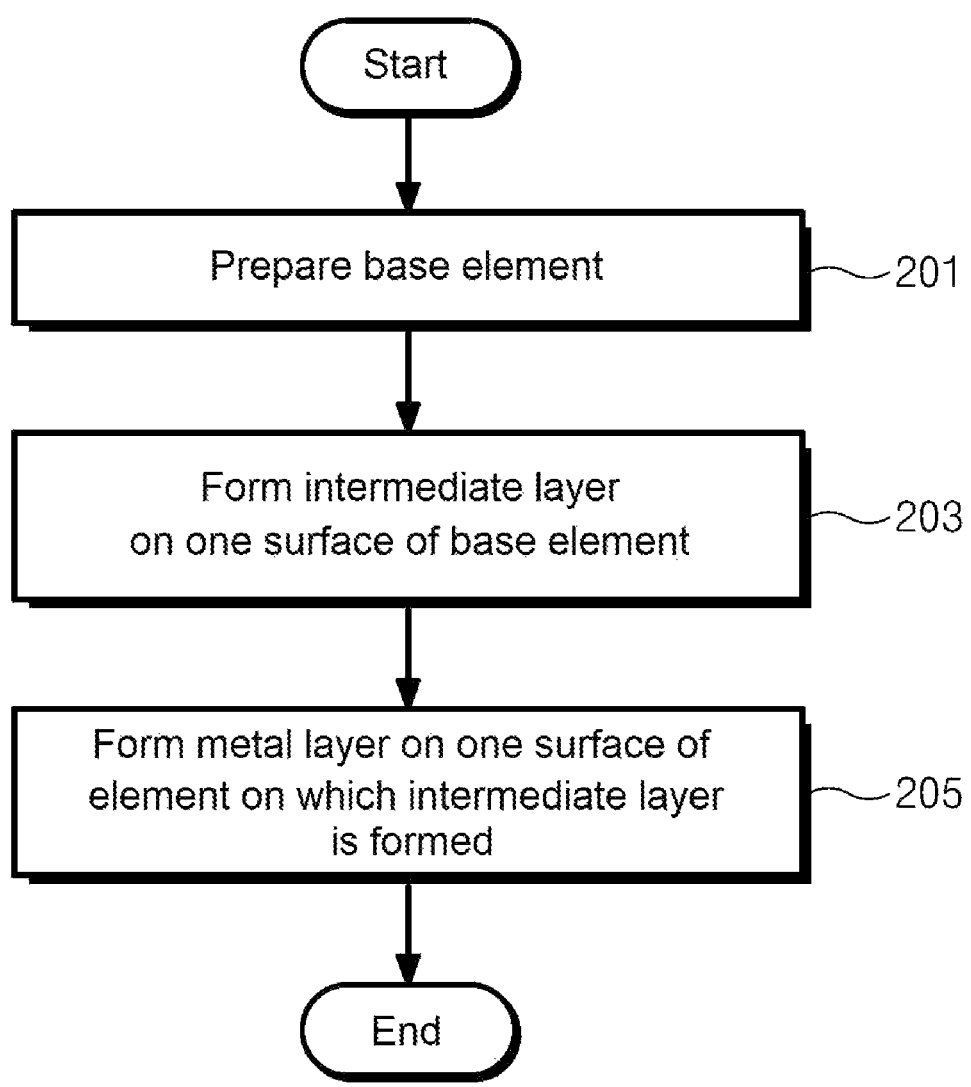
FIG. 10 is a flowchart illustrating a method of manufacturing the semiconductor element of FIG. 1.

FIG. 10 is a flowchart illustrating a method of manufacturing the semiconductor element of FIG. 1.

Referring to FIG. 10, in operation 201, a base element is prepared to manufacture a semiconductor element. As described above, the base element may be a transistor, for example, a field effect transistor (FET), and, in more detail, may be a metal-oxide-semiconductor field effect transistor (MOSFET), a fin field effect transistor (FinFET), a high electron mobility transistor (HEMT), or a junction field effect transistor (JFET).

In operation 203, one or more intermediate layers may be formed on one surface of the base element. In this case, the intermediate layer may be formed on an externally exposed surface of a source and/or a drain of the base element and, depending on example embodiments, may be formed on one of the source and the drain of the base element or may be formed on both of the source and the drain. For example, the intermediate layer may be formed on the base element using an atomic layer deposition (ALD) process. Here, the intermediate layer may be implemented using a dielectric. The dielectric may include, for example, hafnium oxide ($HfO_2$), aluminum oxide ($Al_2O_3$), zirconium dioxide ($ZrO_2$), silicon dioxide ($SiO_2$), silicon nitride (SiN), zinc oxide (ZnO), and/or titanium oxide ($TiO_2$), but is not limited thereto. However, the dielectric available for the base element is not limited thereto and various materials capable of forming a conducting filament may be used for the dielectric. The intermediate layer may be formed with a thickness of about 2 nm to 4 nm, and, if necessary, may be formed with a thicker or thinner thickness than the thickness.

In operation 205, when the one or more intermediate layers are formed, a metal layer may be formed in one direction of the one or more intermediate layers. Here, the one direction of the intermediate layer may be opposite to a direction in which the base element is present. In this case, the metal layer may be formed to correspond to each intermediate layer. The metal layer may be formed on the intermediate layer through a predetermined process. For example, the metal layer may be formed on the intermediate layer using a vapor deposition process such as sputtering.

Therefore, a semiconductor element in a structure of the base element-intermediate layer-metal layer is acquired. As described above, the manufactured semiconductor element may be used as a non-volatile memory element.

Although an example embodiment regarding the semiconductor element and the method of manufacturing the same has described above, the semiconductor element and the method of manufacturing the same are not limited thereto. Various semiconductor elements and methods of manufacturing the same achieved by one of ordinary skill in the art through alterations and modifications thereto may be an example embodiment of the aforementioned semiconductor element and method of manufacturing the same. For example, although the described techniques are performed in different order and/or if components in a described system, architecture, device, or circuit are combined in a different manner or replaced or supplemented by other components or their equivalents, it may be an example embodiment of the aforementioned semiconductor element and method of manufacturing the same.

What is claimed is:

1. A semiconductor element comprising:
a substrate;
a source electrode disposed directly on the substrate;
a first intermediate layer disposed directly on the source electrode;
a first metal layer disposed directly on the first intermediate layer;
a drain electrode separated from the source electrode disposed directly on the substrate;
a second intermediate layer separated from the first intermediate layer and disposed directly on the drain electrode;
a second metal layer separated from the first metal layer disposed directly on the second intermediate layer;
a gate electrode disposed between the source electrode and the drain electrode; and
a gate dielectric disposed directly on the gate electrode,
wherein a conducting filament is formed in an inner space of the first intermediate layer and the second intermediate layer when a first voltage is applied to the first intermediate layer and the second intermediate layer, respectively,
wherein the first metal layer and the second metal layer comprise a metal selected from the group consisting of gold (Au), copper (Cu), nickel (Ni), and titanium (Ti), respectively,
wherein the first intermediate layer and the second intermediate layer comprise a dielectric selected from the group consisting of hafnium oxide ($HfO_2$), silicon dioxide ($SiO_2$), silicon nitride (SiN), aluminum oxide ($Al_2O_3$), zirconium dioxide ($ZrO_2$), and zinc oxide (ZnO), respectively, and
wherein the metal comprised in the first metal layer and the metal comprised in the second metal layer are different from each other.

2. The semiconductor element of claim 1, wherein the conducting filament in the inner spaces of the first intermediate layer and the second intermediate layer is reduced or removed when a second voltage with a polarity opposite to that of the first voltage applied to the first intermediate layer and the second intermediate layer.

3. The semiconductor element of claim 1, wherein magnitude of on-current increases according to formation of the conducting filament.

4. The semiconductor element of claim 1, wherein a thickness of the first intermediate layer and the second intermediate layer has a value between 2 nanometers (nm) and 4 nm, respectively.

5. The semiconductor element of claim 1, wherein the first intermediate layer and the second intermediate layer are disposed on the source electrode and the drain electrode, respectively, using an atomic layer deposition (ALD) process.

6. A method of manufacturing a semiconductor element, the method comprises:
forming a source electrode and a drain electrode separated from the source electrode directly on a substrate;
forming a first intermediate layer directly on the source electrode and forming a second intermediate layer separated from the first intermediate layer directly on the drain electrode;

forming a first metal layer directly on the first intermediate layer and forming a second metal layer separated from the first metal layer directly on the second intermediate layer;

forming a gate electrode between the source electrode and the drain electrode; and forming a gate dielectric directly on the gate electrode wherein a conducting filament is formed in an inner space of the first intermediate layer and the second intermediate layer when a voltage is applied to the first intermediate layer and the second intermediate layer, respectively, wherein the first metal layer and the second metal layer comprise a metal selected from the group consisting of gold (Au), copper (Cu), nickel (Ni), and titanium (Ti), respectively, and wherein the first intermediate layer and the second intermediate layer comprise a dielectric selected from the group consisting of hafnium oxide ($HfO_2$), silicon dioxide ($SiO_2$), silicon nitride (SiN), aluminum oxide ($Al_2O_3$), zirconium dioxide ($ZrO_2$), and zinc oxide (ZnO), respectively, and wherein the metal comprised in the first metal layer and the metal comprised in the second metal layer are different from each other.

* * * * *